(12) United States Patent
Chakrabarty et al.

(10) Patent No.: US 9,482,720 B2
(45) Date of Patent: Nov. 1, 2016

(54) NON-INVASIVE PRE-BOND TSV TEST USING RING OSCILLATORS AND MULTIPLE VOLTAGE LEVELS

(71) Applicant: DUKE UNIVERSITY, Durham, NC (US)

(72) Inventors: Krishnendu Chakrabarty, Chapel Hill, NC (US); Sergej Deutsch, Durham, NC (US)

(73) Assignee: DUKE UNIVERSITY, Durham, NC (US)

( * ) Notice: Subject to any disclaimer, the term of this patent is extended or adjusted under 35 U.S.C. 154(b) by 100 days.

(21) Appl. No.: 13/767,089

(22) Filed: Feb. 14, 2013

(65) Prior Publication Data

US 2014/0225624 A1 Aug. 14, 2014

(51) Int. Cl.
*G01R 31/26* (2014.01)
*G01R 31/3185* (2006.01)

(52) U.S. Cl.
CPC ... *G01R 31/318558* (2013.01); *G01R 31/2601* (2013.01)

(58) Field of Classification Search
CPC .............. G01R 33/26; G01R 31/3016; G01R 31/2882; G01R 31/31858; G01R 31/3187; G01R 29/085; G01R 31/00; G01R 31/024; G01R 31/025; G01R 31/026; G01R 31/08; G01R 31/1272; G01R 31/281; G01R 31/2853; G01R 31/31924; G01R 31/3193; G01R 31/3275; H01L 2924/0002; H01L 22/34; H01L 2225/06541; H01L 2225/06596
USPC ................ 324/520, 509, 527, 750.24, 750.3, 324/762.01, 762.05, 500, 512, 521, 522, 324/523, 525, 528, 531–535, 537, 538, 555, 324/750.1, 754.12, 754.13, 754.14, 755.11, 324/756.01, 756.02, 756.05, 756.07, 324/757.02, 763.01, 763.02, 718, 762.02, 324/762.03, 762.09; 702/71, 72, 66, 81, 702/117, 182
See application file for complete search history.

(56) References Cited

U.S. PATENT DOCUMENTS

| | | | | |
|---|---|---|---|---|
| 5,790,479 A | * | 8/1998 | Conn | 368/118 |
| 5,818,250 A | * | 10/1998 | Yeung et al. | 324/762.02 |
| 6,128,757 A | * | 10/2000 | Yousuf et al. | 714/724 |
| 2010/0153043 A1 | * | 6/2010 | Su et al. | 702/71 |
| 2010/0213965 A1 | * | 8/2010 | Chen | 324/765 |
| 2010/0321042 A1 | * | 12/2010 | Agarwal et al. | 324/681 |

(Continued)

OTHER PUBLICATIONS

Kondo et al., Propagation Delay Analysis of a Soft Open Defect Inside a TSV, Transactions of the Japan Institute of Electronics Packaging, vol. 4, No. 1, p. 119-126, 2011 (Kondo).*

(Continued)

*Primary Examiner* — Arleen M Vazquez
*Assistant Examiner* — Lee Rodak
(74) *Attorney, Agent, or Firm* — Talem IP Law, LLP (57) ABSTRACT

A design for test (DfT) architecture is provided that enables pre-bond parametric testing of through-silicon vias (TSVs). A grouping of N number of input/output (I/O) segments are configured to receive a test signal in a feedback loop, where each I/O segment includes one or more buffers (or inverters) and a TSV connected at one end to the one or more buffers. The TSV acts as a shunt-connected capacitor—when defect free—and includes a load resistance when the TSV contains a defect. Each I/O segment can also include one or two multiplexers to control whether the I/O segment receives a test or functional signal and, optionally, whether the I/O segment is bypassed or included in the ring oscillator. The varying loads caused by the defects cause variations in the delay across the buffers (or inverters) of an I/O segment that can be detected in the output signal.

9 Claims, 10 Drawing Sheets

(56) References Cited

U.S. PATENT DOCUMENTS

| | | | |
|---|---|---|---|
| 2011/0102006 A1* | 5/2011 | Choi et al. | 324/750.3 |
| 2011/0267092 A1* | 11/2011 | Hargan et al. | 324/762.01 |
| 2012/0025846 A1* | 2/2012 | Minas et al. | 324/606 |
| 2012/0138927 A1* | 6/2012 | Kang | 257/48 |
| 2013/0002276 A1* | 1/2013 | Jeong | 324/750.3 |

OTHER PUBLICATIONS

Chen et al., On-Chip TSV Testing fo 3D IC before Bonding Using Sense Amplification, IEEE Asian Test Symposium, p. 450-455, 2009 (Chen).*

Jun So Pak et al. "Optimized Inverter Design of Ring Oscillator based Wafer-Level TSV connectivity Test (RO-TSV-CT)," 2012 IEEE Electrical Design of Advanced Packaging and Systems Symposium (EDAPS), p. 239-242, Dec. 2012.*

Jun So Pak et al., "Wafer-Level TSV Connectivity Test using Ring Oscillator Scheme," IEEE Electrical Performance of Electronic Packaging and Systems (EPEPS) Conference Proceedings, Oct. 21-24, 2012.*

Yu-Hsiang Lin, Shi-Yu Huang, "A Unified Method for Parametric Fault Characterization of Post-Bond TSVs," 2012 IEEE International Test Conference, paper 12.1.*

You, Jhih-Wei, et al., "Performance Characterization of TSV in 3D IC via Sensitivity Analysis," 2010 19th IEEE Asian Test Symposium, pp. 389-394.

* cited by examiner

NON-INVASIVE PRE-BOND TSV TEST USING RING OSCILLATORS AND MULTIPLE VOLTAGE LEVELS

This invention was made with government support under Federal Grant No. CCF-1017391 awarded by the National Science Foundation. The government has certain rights in the invention.

BACKGROUND

Three-dimensional (3D) stacking with through-silicon vias (TSVs) is gaining considerable traction in the semiconductor industry due to its benefits over traditional stacking with wire-bonds. Unlike wire-bonds, TSVs go directly through the substrate, consuming relatively little silicon area and allowing for high-performance, high-density, and low-power inter-die connections in integrated circuits (ICs).

Testing of 3D ICs for manufacturing defects pose major challenges for the semiconductor industry. One of these challenges involves defects, such as voids and pinholes, from the TSV manufacturing process. Voids are formed due to insufficient filling of a via. A pinhole is an oxide defect that creates a short between the TSV and the substrate. Many of these defects arise prior to the bonding process. Therefore, they can be targeted during pre-bond testing, increasing the probability of getting a known good die (KGD) prior to bonding and therefore increasing the product yield. It has been widely acknowledged that the lack of KGD can be a serious yield limiter for 3D stacking.

However, pre-bond testing of TSVs can be difficult due to test access limitations. First, prior to wafer thinning, TSVs are buried in silicon and are only accessible at their front-side through the logic connected to the TSVs. Second, even though the back-side of a TSV is exposed after wafer thinning, probing the back-side can be challenging because of strict requirements on the probing equipment. Recent studies report success in mechanical probing at array pitches of 40 µm; however, such probing solutions are still being researched and it remains to be seen how easily they can be used in practice. Therefore, alternative solutions that do not rely on probing are being investigated.

BRIEF SUMMARY

Techniques and structures are described for pre-bond testing of through-silicon vias (TSVs). According to certain embodiments, pre-bond testing of TSVs is accomplished by configuring a ring oscillator from I/O segments on a chip before bonding and detecting resistive open faults and leakage faults in TSVs from characteristics of the oscillating output signal. A parametric test can be carried out in which variations in electrical parameters of the TSVs are detected to determine whether a defect exists in a TSV.

According to an embodiment, a method of pre-bond testing of TSVs includes configuring a grouping of N number of I/O segments to receive a test signal in a feedback loop, where each I/O segment includes one or more buffers (or inverters) and a TSV connected at one end to the one or more buffers. The TSV acts as a shunt-connected capacitor—when defect free—and includes a load resistance when the TSV contains a defect. The varying loads caused by the defects cause variations in the delay across the buffers (or inverters) of an I/O segment that can be detected in the output signal.

The N I/O segments with feedback inverter form a ring oscillator that oscillates at a first frequency. Each I/O segment can include an even number of buffers such that any number of I/O segments plus the feedback inverter result in an odd number of inverters and creation of a ring oscillator. Testing can involve obtaining a signal representing the ring oscillator loop with the TSVs bypassed (representing a defect-free TSV path) and then the ring oscillator loop with the TSVs included. A defect in a TSV causes a change in the load of the I/O driver, resulting in a different delay compared to a defect-free path. By monitoring the delay, it can be determined that a defect exists.

According to various embodiments, multiple TSVs can be tested at once and without invasive probing.

Embodiments of the TSV test methods described herein are non-invasive and no probing with external equipment is necessary. According to one aspect, by not requiring TSV probing, the test cost is low and the design-for-test (DfT) area overhead is negligible.

According to another aspect, custom cells are not required to be inserted into the design in order to enable pre-bond testing of TSVs. Instead, standard cells—including multiplexers and buffer/inverters—can be used to configure ring oscillators during testing.

According to yet another aspect, multiple supply voltage levels can be used to increase the detection sensitivity and robustness for both resistive-open faults and leakage.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIG. 11A shows N=1; FIG. 11B shows N=2; and FIG. 11C shows N=3.

DETAILED DISCLOSURE

Methods for non-invasive pre-bond through-silicon via (TSV) test using ring oscillators and multiple voltage levels are described. According to certain embodiments, ring oscillators are used to generate delay lines connected to TSVs. TSV faults, including resistive opens and leakage faults, can be detected by measuring variations in the delay of circuit elements (i.e., buffers, wires/conductive lines) connected to TSVs.

In general, a ring oscillator is formed by a chain of an odd number of inverters of which a last inverter's output feeds back to a first inverter's input. Due to inversion of the signal in the loop, the signal keeps oscillating with a frequency that depends on the delay of the elements in the loop. The oscillation frequency also depends on the loads of each inverter of the ring. Embodiments exploit this characteristic of ring oscillators to extract information regarding defects in TSVs.

According to an embodiment, a method of pre-bond testing of TSVs includes configuring a grouping of N number of I/O segments to receive a test signal in a feedback loop, where each I/O segment includes one or more buffers (or inverters) and a TSV connected as a load at one end to the one or more buffers. The varying loads caused by the defects cause variations in the delay across the buffers (or inverters) of an I/O segment that can be detected in the output signal. A multiplexing scheme is further incorporated to select TSVs for an oscillating ring as well as to enable test mode (as opposed to logic/functional mode).

Since a TSV is a passive structure resembling a wire, a TSV can be modeled using a combination of lumped R, C, and L elements. The inductance of a TSV is relatively small and has no significant effect below a few GHz signal frequency; therefore embodiments model the TSVs as RC circuits.

The TSVs can provide a capacitive and/or resistive load depending on whether there is a defect in the TSV and what type of defect, if one exists, is in the TSV. When defect free, the TSV acts as a shunt-connected capacitor, and when the TSV contains a defect, the TSV includes a load resistance (in connection with capacitive impedance).

Several TSV defects can be modeled by resistive opens and leakage faults. For instance, micro-voids increase the TSV resistance at the defect location and thus can be modeled as a resistive-open fault. Pinholes create a conduction path from the TSV to the substrate, resulting in a leakage fault.

Figure 1A:
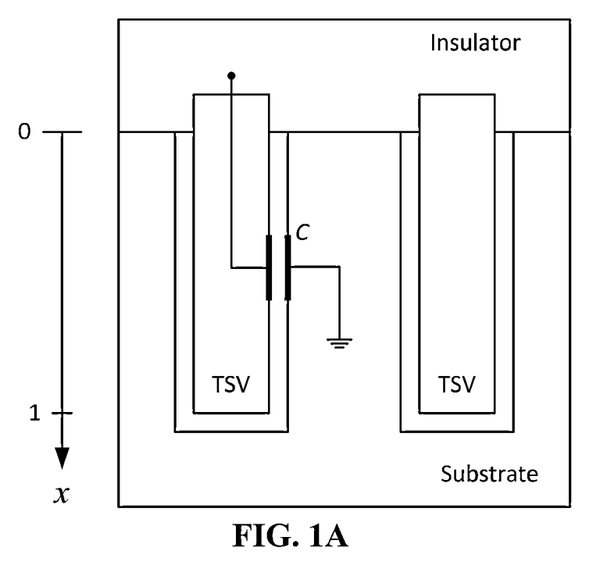
FIGS. 1A-1C illustrate simple electrical TSV models for three cases: fault-free (FIG. 1A), resistive-open fault representing a micro-void (FIG. 1B), and leakage representing a pinhole (FIG. 1C).
Figure 1B:
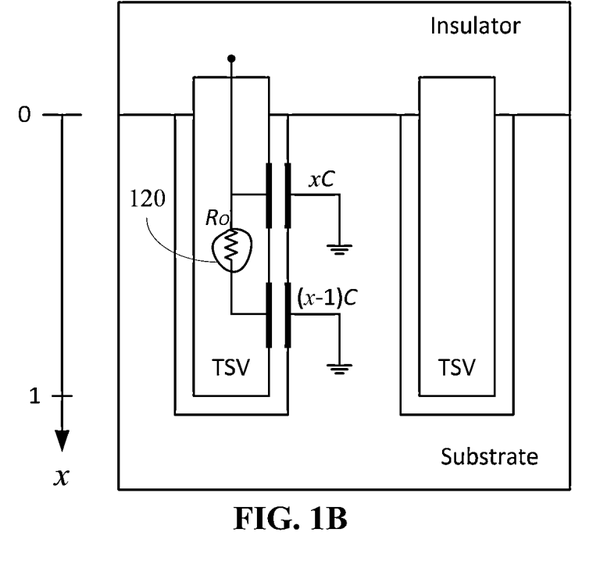
Figure 1C:
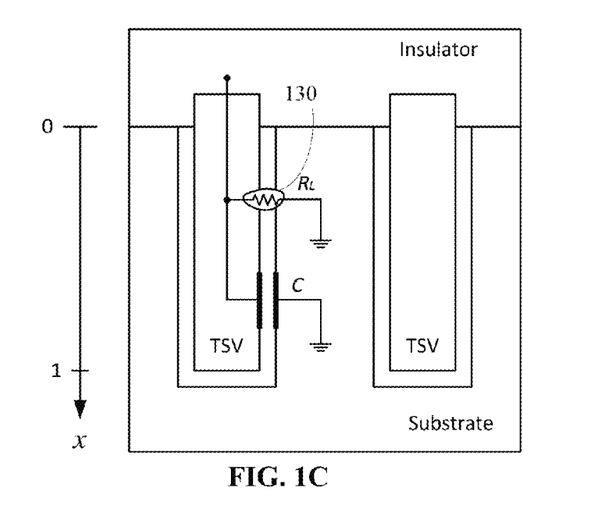

FIGS. 1A-1C illustrate simple electrical TSV models for three cases: fault-free, resistive-open fault, and leakage.

Referring to FIG. 1A, in the fault-free case, a TSV can be modeled as a single RC segment or multiple RC segments, where R is the TSV resistance and C is the capacitance between the TSV and the substrate. The parameters R and C depend on the TSV technology. For example, a current technology node may be modeled with R=0.1Ω, C=59 fF. Since R is significantly smaller than the output resistance of a typical driving gate, this resistance can be neglected. The resulting model is a "lumped" capacitor between the TSV and substrate, as shown in FIG. 1A.

FIG. 1B shows a micro-void in the TSV at an arbitrarily chosen location x and the corresponding electrical model. This defect divides the TSV into two segments. The "top" segment ([0, x]) is the part of the TSV from the top of the TSV until the fault location and can be approximated as a capacitor with the scaled-down capacitance xC. The "bottom" segment ([x; 1]) includes the remaining part of the TSV capacitance (1−x)C and the increased resistance of the open resistance $R_O$ that depends on the size of the void. The parameter $R_O$ can vary from a few Ω in the case of a micro-void to infinity in the case of a full open in the TSV.

FIG. 1C shows a leakage defect, such as a pinhole defect, which creates a conduction path from the TSV to the substrate. The leakage is modeled by the resistor $R_L$, which is in parallel to the TSV capacitance. The value of $R_L$ might decrease over time, since leakage faults tend to deteriorate. Such defects can be a serious concern for lifetime chip reliability.

In order to detect the resistive open and leakage faults, a design for test (DfT) architecture is provided that enables parametric testing. Deviations in TSV parameters due to defects lead to variations in the propagation delay of the circuit elements connected to the TSV. These variations can be measured by ring oscillators. A ring oscillator is a feedback loop containing an odd number of inverters; however, in some cases an even number of inverter stages may function as a ring oscillator under certain conditions.

According to certain embodiments, the ring oscillators can be created using the existing TSV drivers and receivers. The TSVs provide the loads and deviations in TSV parameters lead to variations in the propagation delay of the circuit elements connected to the TSVs. The propagation delay variations result in variations in the oscillation period. The oscillation period can be captured by, for example, on-chip DfT hardware based on a binary counter or linear-feedback shift-register and compared with an expected value.

Resistive opens and leakage defects have different impacts on the oscillation period. In the case of a resistive open as shown in FIG. 1B, the top part of the TSV capacitance xC is separated from the bottom capacitance (x−1)C, which increases the charging and discharging rate for the top capacitor. This leads to a decreased delay between the driver and receiver buffers. Therefore, the oscillation period decreases as well.

A leakage fault, such as shown in FIG. 1C, has a different effect on the oscillation period. Due to charge leakage to the ground through $R_L$, the driver charges the TSV capacitance slower but discharges it faster. However, the impact on the charging rate is stronger. Therefore, the period of one oscillation cycle including one low-to-high transition and one high-to-low transition is larger than in a fault-free case.

Figure 2:
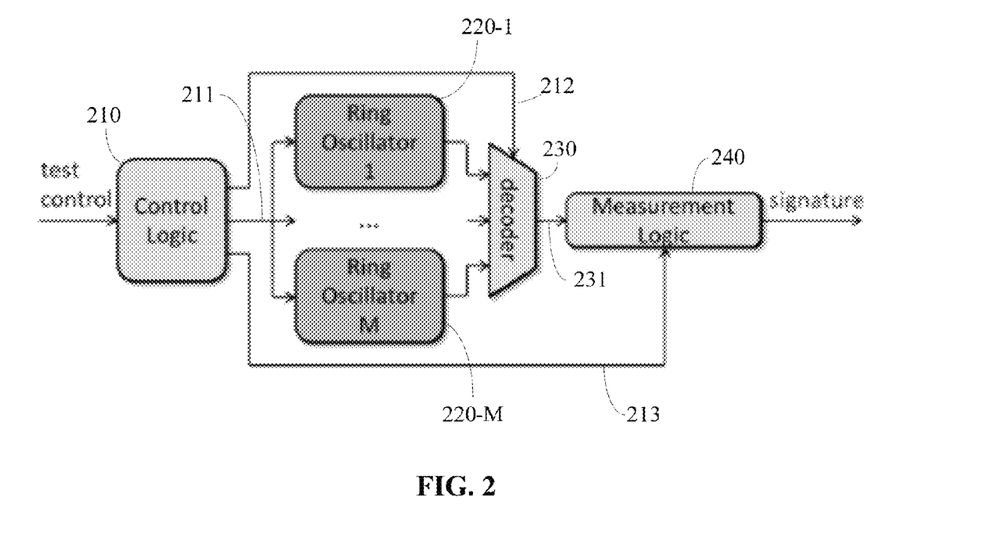
FIG. 2 shows a DfT architecture for pre-bond TSV test according to an embodiment of the invention.

FIG. 2 shows a DfT architecture for pre-bond TSV test according to an embodiment of the invention. As shown in FIG. 2, the DfT architecture can include control logic 210, ring oscillators (220-1 . . . 220-M), a decoder 230, and measurement logic 240. The control logic block 210 receives test control signals from the test equipment or from a higher-level DfT structures that control this part of DfT logic. The control logic 210 generates signals to control the ring oscillators 220-1 . . . 220-M (ring oscillator control signal(s) 211), to select which ring oscillator is measured (select signal 212), and to start, stop and reset the measurement logic (measurement logic control signal 213).

The signals from the ring oscillators 220-1 . . . 220-M can be fed through the decoder 230 to the measurement logic 240. The measurement logic 240 can be implemented as an n-bit binary counter that uses the oscillating signal 231

(output from the decoder) as clock. The count after a fixed amount of time can be directly mapped to an oscillation frequency. Alternatively, a linear feedback shift register (LFSR) can be used to implement the measurement logic 240 in the same way as a binary counter. The LFSR approach requires less gates for the same upper limit on the count; however, a look-up table is used to determine the oscillation frequency corresponding to the current LFSR state. The resulting signature from the measurement logic 240 is read and interpreted by the test equipment.

Figure 3A:
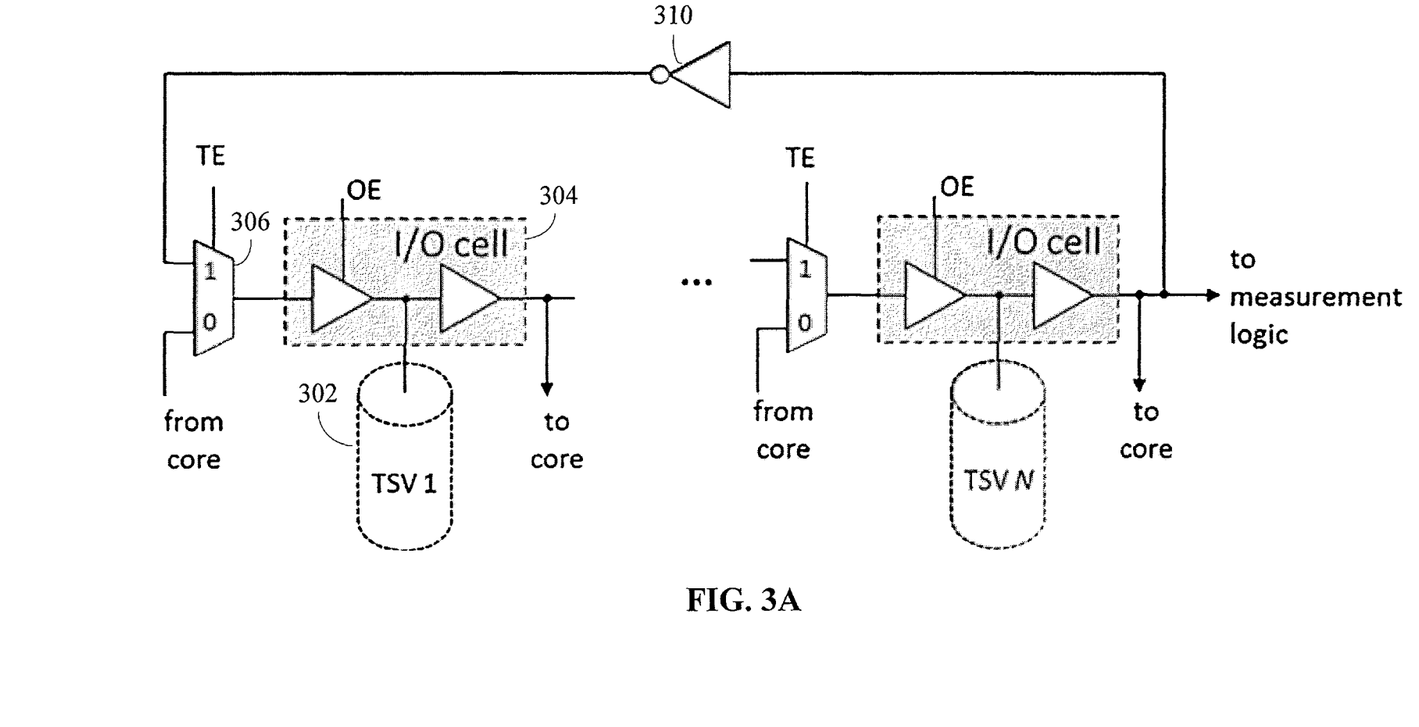
FIGS. 3A and 3B show diagrams of a ring oscillator with N TSVs according to certain embodiments of the invention.
Figure 3B:
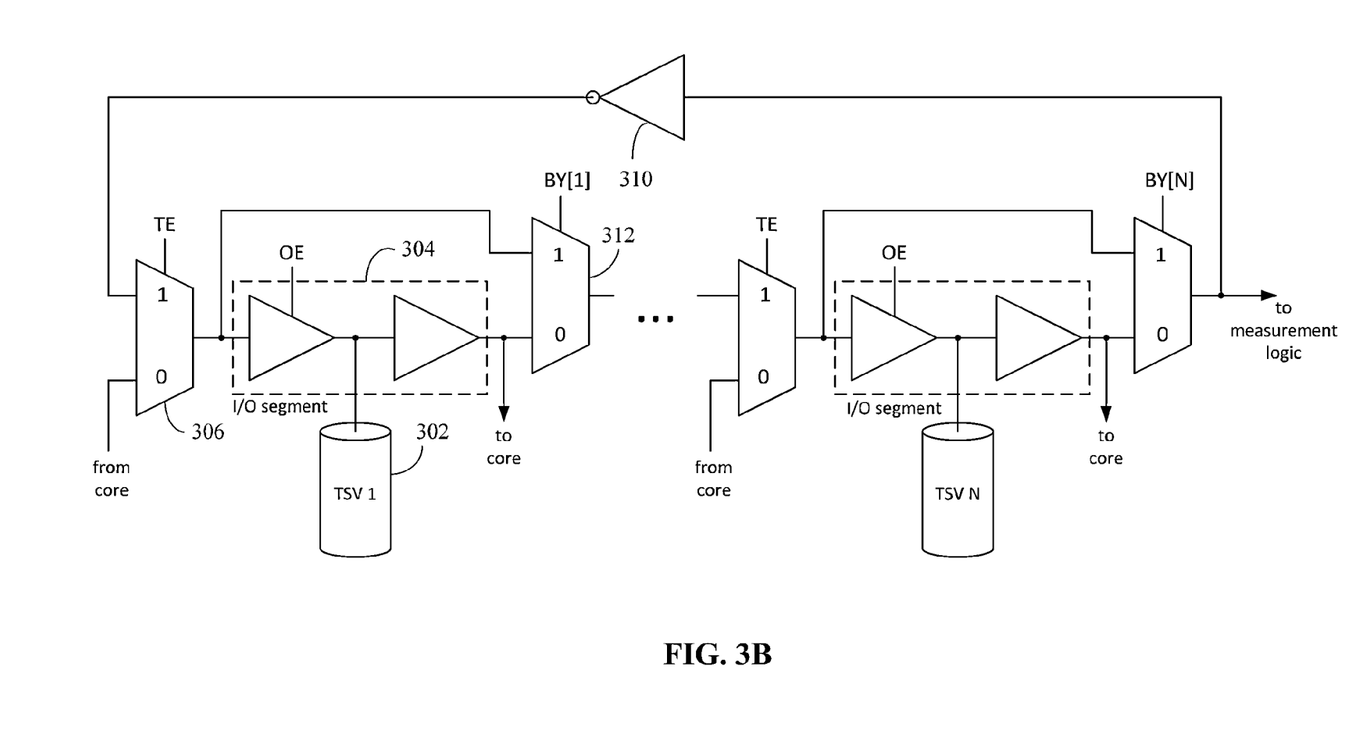

According to certain embodiments, a ring oscillator, such as ring oscillator 220-1 of FIG. 2, is provided by combining N I/O segments and one inverter, as shown in FIGS. 3A and 3B. This configuration allows for the simultaneous testing of S TSVs (where 1≤S≤N) and determining whether one of the TSVs under test is faulty. Since resistive opens and leakage faults have the opposite effect on propagation delay, the total delay in a group with two faulty TSVs (one a resistive open and the other a leakage) can be unchanged causing the faults to be overlooked. However, such pairs of faults (and the associated defect-induced delay combinations that cancel out each other) are unlikely (e.g., negligible) for high-yield TSV processes used in high-volume 3D chip production.

Referring to FIGS. 3A and 3B, each I/O segment includes a TSV 302 and an I/O cell 304 connected to the front side of the TSV 302. The I/O cell 304 includes a driver and a receiver with the TSV having one end connected at a node between the driver and the receiver. A first buffer can be used for the driver and a second buffer may be the receiver. According to certain embodiments, the I/O cells used to implement the ring oscillator for pre-bond testing can be the I/O cells already in place as part of the functional circuitry common in industrial designs. In some embodiments, TSVs can also be enhanced with tri-state drivers so that they can be driven appropriately. Embodiments of the I/O cell 304 incorporating tri-state buffers as the drivers can be referred to as bidirectional I/O cells.

The signal TE (test enable) controls the multiplexers 306 selecting between the functional outputs coming from the internal logic (e.g., from core) and the oscillator loop (e.g., from inverter 310). In the embodiments shown in FIGS. 3A and 3B, if TE=0, the multiplexers 306 select the functional outputs coming from the internal logic, enabling a functional mode. If TE=1, the circuit is configured in an oscillator loop, enabling a TSV test mode.

FIG. 3B shows an embodiment further including multiplexers 312 for enabling an I/O cell bypass. The signals BY[1] . . . BY[N] (Bypass) control the multiplexers 312 that include or exclude a TSV (such as TSV 1 302) from the oscillator loop. The configuration shown in FIG. 3B can be used in certain embodiments to minimize the effects of delay variations due to process variation on testing TSVs across a chip.

For embodiments using tri-state drivers in place of, or in addition to, buffers in the I/O cells 304, the OE (output enable) controls the tri-state drivers of the I/O cells 304 to "remove" (by causing the output port to become high impedance or "floating") or include the driver from the oscillator loop circuit. In functional mode, this signal is set by the internal logic. In test mode, OE is set to 1 to enable the drivers.

The number of TSVs in a group (N) can be selected based on the desired oscillation frequency. In one extreme case, if N=1, the ring oscillator contains only a couple of gates, which results in a relatively short oscillation delay (or high frequency). Such an oscillation frequency might be too high to drive the on-chip measurement logic. By appending extra segments, the delay can be increased and thus the oscillation frequency is reduced, relaxing the speed requirement on the measurement circuitry. In addition, all TSVs in the same group can share the same counter without extra decode logic, since all of them are in the oscillator loop. This reduces wiring and the amount of DfT logic.

Figure 4:
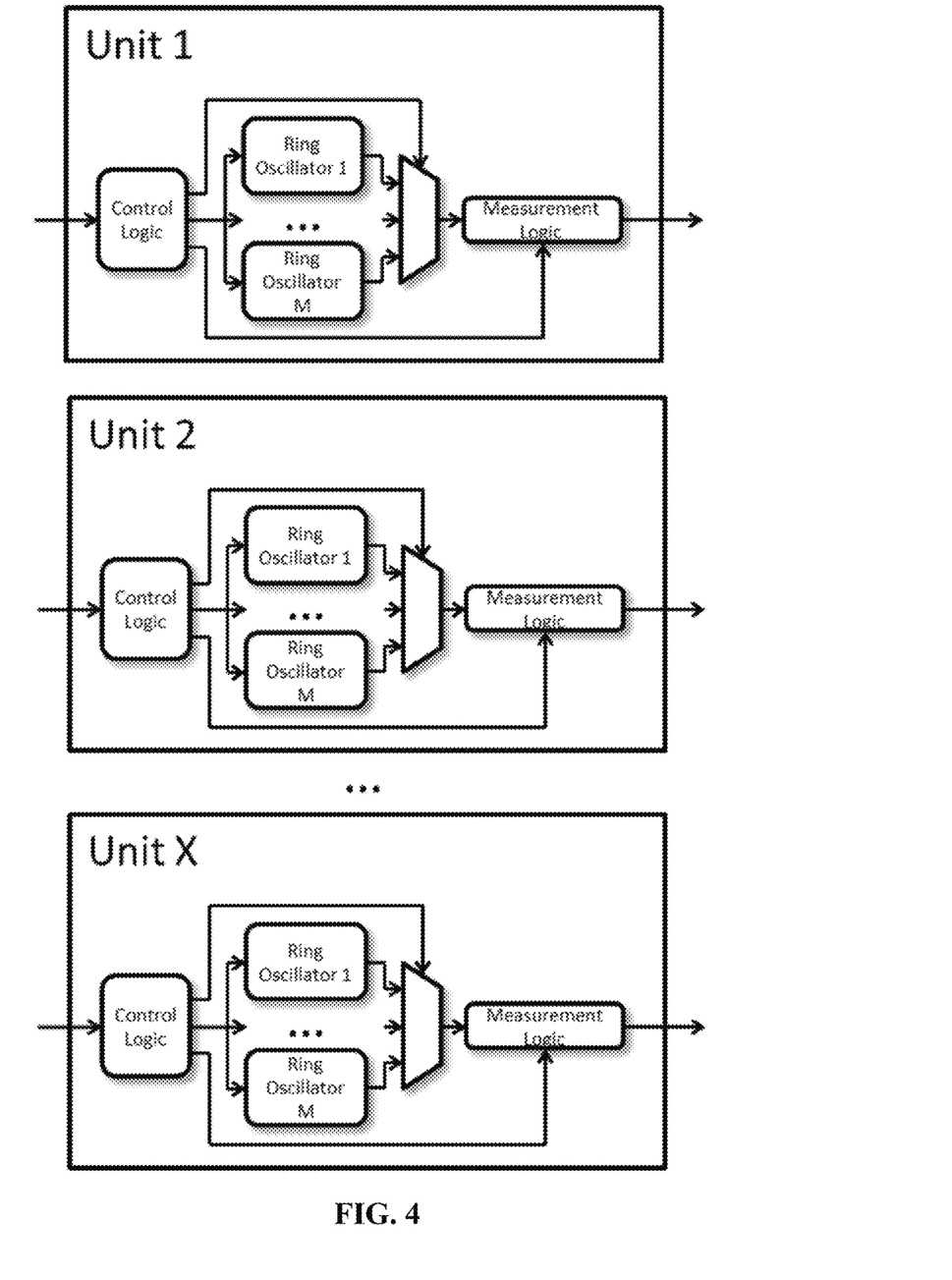
FIG. 4 shows a DfT system architecture according to an embodiment of the invention.

According to various embodiments, the number of TSVs in a group N can be 1, 2, 3, 4, 5, 6, 7, 8, 9, 10, 11, 12, 13, 14, greater than 15, 20, 50, 100, or more or less. The number of TSVs in a group can be selected based on a desired resolution for detection, where fewer TSVs can provide a higher resolution and more TSVs can provide faster test times (due to parallel testing). In one embodiment, 1-3 TSVs are included in each ring oscillator group and X number of independent measurement circuits can test X*N TSVs in parallel, as shown in FIG. 4.

In some embodiments, overlapping groups can be created. For example, in a case where 100 TSVs are being tested in groups of 20 TSVs (N=20), a first set of parallel tests may be carried out on TSVs 1-20, 21-40, 41-60, 61-80, and 81-100; then, a second set of parallel tests may be carried out on TSVs 11-30, 31-50, 51-70, 71-90, and the combination of 1-10 and 91-100.

Figure 5:
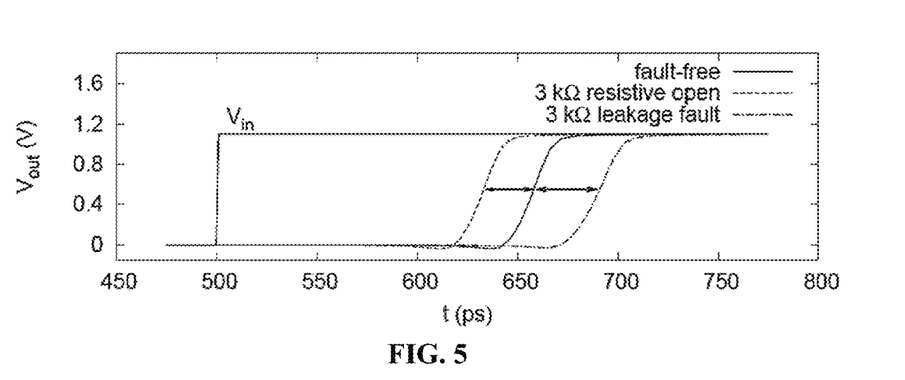
FIG. 5 shows a simulation plot of output voltage waveforms comparing output for a fault-free case with a 3 kΩ open-resistive fault case and a 3 kΩ leakage fault case at x=0.5.

FIG. 5 shows waveforms of the simulated voltages $V_{out}$ measured at the I/O cell outputs ("to core") if a step function is applied at the input of the cell. In presence of a 3 kΩ resistive open at x=0.5, the propagation delay of the cell with the TSV as load is reduced by ≈20 ps. A 3 kΩ leakage fault, in contrast, increases the propagation delay by ≈30 ps. Thus, since the propagation delay of the I/O cell adds to the oscillation period T of the ring oscillator, both types of faults can be detected by comparing T with that of the fault-free case.

Figure 6A:
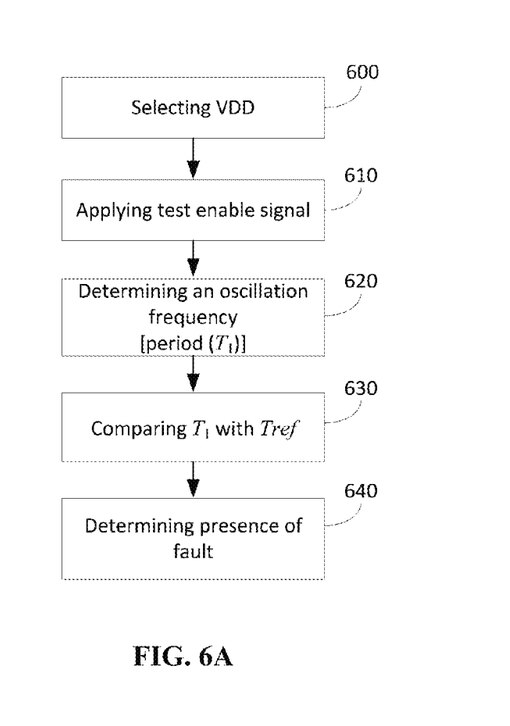
FIGS. 6A and 6B show process flow diagrams for performing a pre-bond TSV test according to certain embodiments of the invention.

FIG. 6A shows a process flow diagram for performing a pre-bond TSV test according to an embodiment of the invention. In one embodiment, such as shown in FIG. 6A, as one of the initial steps, a supply voltage VDD can be selected for powering the DfT (600). Then, pre-bond testing can be carried out by applying a test enable signal (610) to test the TSVs, which are connected as loads of a ring oscillator in a manner such as shown in FIG. 3A. A test signal is applied and the oscillation frequency (oscillation period $T_1$) of each ring oscillator (e.g., 220 of FIG. 2) can be measured (620). The measured oscillation period is compared to a reference oscillation period Tref (630). The comparison (i.e., the deviation from the reference) is used to determine the presence of a fault (640). The reference oscillation period may be obtained by testing a number of fault-free TSVs and using an average value. For example, the reference oscillation period may be obtained by actual measurement of the oscillation period for multiple ring oscillator configured TSVs during a beginning of a production testing stage (e.g., on "first silicon").

During operation 600, the supply voltage level can be selected to maximize the detection of certain faults. The selected supply voltage level can be a standard power level for a particular technology node (e.g., 3.3 V, 1.2 V), a variation (e.g., + or −10% VDD) of a standard power level, or a test optimized voltage level. In some embodiments, multiple iterations of the testing (operations 600, 610, 620, 630, 640) can be performed on the same TSVs using different voltage levels. In one iteration, beginning at operation 600, the supply voltage level VDD can be selected to be at one level. Then in another iteration, beginning again at operation 600, the supply voltage level VDD can be selected to be at another level.

Figure 6B:
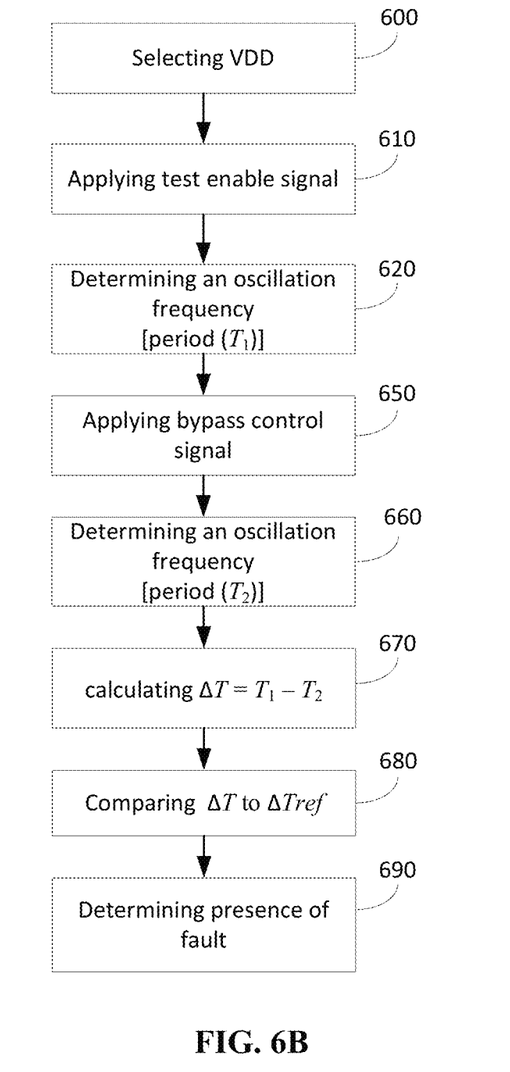

FIG. 6B shows a process flow diagram for performing a pre-bond TSV test according to another embodiment of the invention. Similar to that described with respect to FIG. 6A, pre-bond testing can be carried out by selecting a supply voltage VDD (600), applying a test enable signal (610) to test the TSVs, which in this case may be configured with a bypass enable such as shown in FIG. 3B, and applying a test signal. When applying the test signal, the oscillation frequency (oscillation period $T_1$) of each ring oscillator (configured with at least one of the TSVs connected as a load) can be measured (620). Different from the embodiment shown in FIG. 6A, a second measurement is obtained for a bypassed TSV ring oscillator configuration. For example, a bypass signal is applied to bypass all the TSVs in each ring oscillator (650). For the bypassed TSV configuration, the test signal is again applied and the oscillation frequency (oscillation period $T_2$) of each ring oscillator (configured with all the TSVs bypassed) can be measured (660).

A difference ($\Delta T = T_1 - T_2$) between the TSV connected oscillation period and the bypassed TSV oscillation period is calculated (670). This difference value is then compared to a reference difference value ($\Delta T_{ref}$) (680) and the deviation from the reference difference value used to determine the presence of a fault (690). The reference oscillation periods ($T_{1ref}$ and $T_{2ref}$) may be obtained by actual measurement of the oscillation period, for example, during a beginning of a production testing stage (e.g., on "first silicon"). These early measurements can be averaged (with outliers removed) and used as the reference difference value ($\Delta T_{ref}$) for a fault-free $\Delta T_{ref} = T_{1ref} - T_{2ref}$. This process may be repeated using various groupings of TSVs as well as using various supply voltage levels. Variation of supply voltage levels allows for increased detectability of certain faults. Resistive-open faults can be easier to distinguish from the fault-free case at higher voltage levels. Leakage faults are easier to detect at lower voltage levels.

In some embodiments, the different voltage levels can be applied through the supply voltage line from a device tester.

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

Simulation Overview

Simulations with Synopsys HSPICE simulation software were conducted to illustrate the effectiveness of the pre-bond testing using a ring oscillator configuration. For the simulations, the fault-free, micro-void, and pinhole TSV models as described with respect to FIGS. 1A-1C were used along with the 45 nm Predictive Technology Model (PTM) low-power CMOS models. BUF_X4 buffers from the Nangate 45 nm Open Cell Library were used as TSV drivers. For other gates, X1 versions from the Nangate 45 nm Open Cell Library were used.

First, a resistive-open fault was simulated in one of the TSVs at the location x=0.5 as depicted in FIG. 1B. An HSPICE circuit model was created of the ring oscillator shown in FIG. 3 with N=5 TSVs and then $R_O$ was swept from 0Ω (no fault) to 3 kΩ (strong resistive open) at the nominal voltage $V_{DD}$=1.1 V. With this model, transient analysis was performed and the oscillation period of the ring oscillator T was recorded. In the first run, TSV1 is enabled (BY[1]=0) and all other TSVs are bypassed (BY[2 . . . N]=1). In the second run, all TSVs are disabled. Subsequently, the oscillation period of the second run $T_2$ is subtracted from that of the first run $T_1$ for each value of $R_O$:

$$\Delta T = T_1 - T_2$$

The above subtraction step removes the propagation delay of the path through I/O cells 2 . . . N and the inverter. The remainder is virtually the propagation delay due to the I/O cell and TSV1, which is under test. This approach greatly reduces the effect of delay variations in gates and interconnects due to random process variations.

With only a single TSV under test, the test resolution can be maximal; however, as described above, more than 1 TSV can be tested within a single ring oscillator group.

Figure 7:
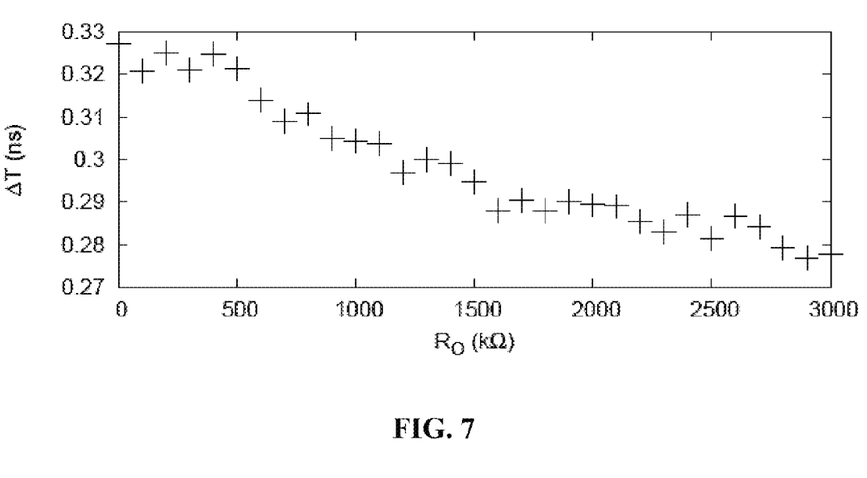
FIG. 7 shows a Monte Carlo (MC) simulation plot for a TSV with a resistive open defect of size 1 kΩ, showing ΔT as a function of $R_O$ at location x=0.5 and at 1.1 V supply voltage.

The results of this simulation are shown in FIG. 7. As expected, an increase in the resistance $R_O$ leads to a reduction of the oscillation period. This indicates that it is possible to detect resistive opens of a sufficient size by measuring the oscillation period. For instance, $\Delta T$ of a resistive fault of size 1 kΩ at x=0.5 is reduced by 10% compared to the fault-free case that can be identified.

During actual test, the values $T_1$ and $T_2$ are measured by the on-chip DfT and the results sent to the test equipment and post-processed there. Alternatively, it is possible to implement on-chip logic for the post-processing and reduce the shift-out time. Other approaches are also contemplated. According to certain embodiments, $T_1$ is measured when the TSVs under test are enabled and $T_2$ is measured when the TSVs in the group are all bypassed.

Resistive-Open Faults Simulation Examples

The location x of the fault affects fault detection. As faults are located farther up the TSV to the top of the TSV where the TSV connects to the driver, the more easily the fault is detectable. A void at the bottom of the TSV may not readily be detectable during pre-bond test.

In a real (3D) IC, propagation delays of gates vary significantly because of random process variations. In general, the test method relies on relatively constant delays in the DfT circuitry in order to detect variations of the delay on the circuit elements connected to the TSV. However, to illustrate the ability of the method described herein for robustness to random process variations, the following experiments using the HSPICE simulation software are provided.

To see the effect of process variations and the effect of applying different supply voltages, Monte Carlo (MC) simulations were performed using the model described above in the section entitled Simulation Overview, extended by the following process-variation model: $3\sigma_{V_{th}}=3$, $3\sigma_{L_{eff}}=10\%$, where $\sigma_{V_{th}}$ is the variation in threshold voltage and $\sigma_{L_{eff}}$ is the variation in gate length for the transistors forming the inverters.

Figure 8:
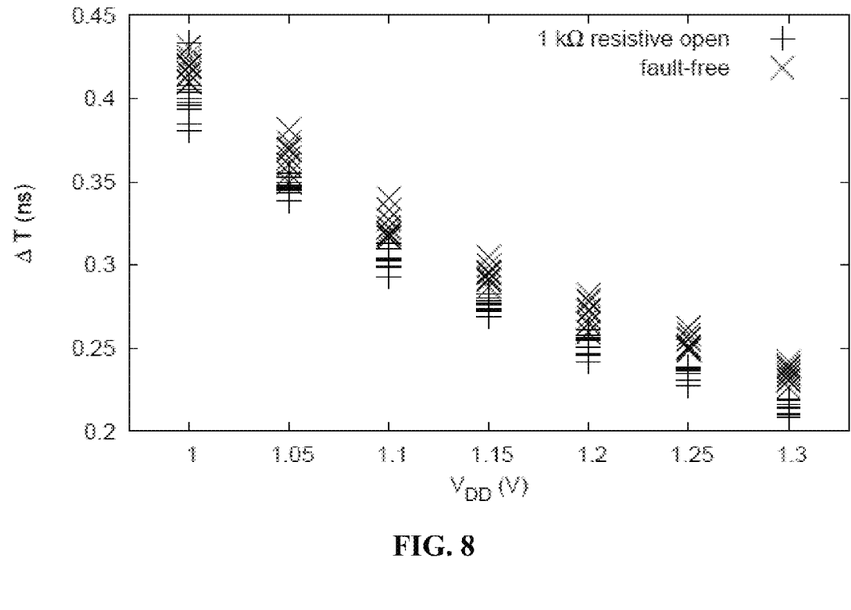
FIG. 8 shows a MC simulation plot for a fault-free TSV and a TSV with a resistive open defect of size 1 kΩ, showing ΔT as a function of supply voltage comparing the fault-free case with the case of 1 kΩ resistive open at x=0.5.

FIG. 8 shows the results of MC simulation for a fault-free TSV and a TSV with a resistive open defect of size 1 kΩ. The supply voltage was varied to analyze the spread in the fault-free and faulty cases. At lower supply voltage levels, a part of data points from both fault-free and faulty cases overlap and thus become indistinguishable. If the supply voltage is increased, this overlap reduces to a minimum until no aliasing is witnessed. For example, as shown in FIG. 8, at $V_{DD}$=1.3V, there is no overlap between the faulty (1 kΩ resistive open) and fault-free cases, whereas at $V_{DD}$=1V, the faulty and fault-free cases overlap (see $\Delta T$ at 0.4 to −0.44) and are not distinguishable from each other.

Accordingly, even in presence of process variations, the pre-bond TSV test method using ring oscillators allows for detection of resistive-open defects that have a sufficiently large size and are located in the upper part of the TSV. The test resolution depends on the process variation: the more variation, the harder it becomes to distinguish small resistive opens from the fault-free case. In addition, a higher supply voltage results in a better resolution: aliasing is reduced, allowing for detection of smaller resistive-open faults.

Leakage Faults Simulation Examples

Leakage faults exhibit a different behavior than resistive open faults. To illustrate the behavior of leakage faults, the configuration described with respect to FIG. 3 with N=5 and the TSVs modeled as shown in FIG. 1C was simulated.

Figure 9:
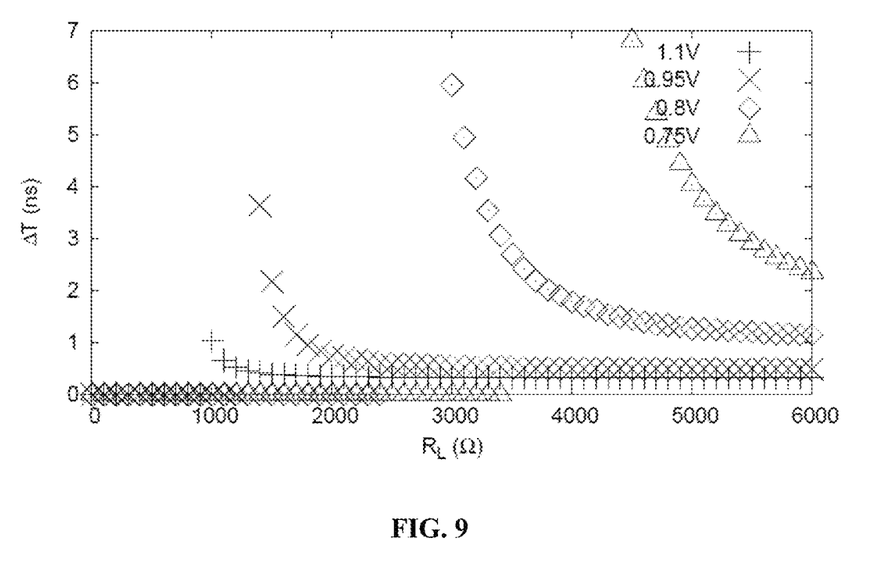
FIG. 9 shows a MC simulation plot for a TSV with a leakage fault, showing ΔT as a function of $R_L$ at different voltage levels.

FIG. 9 shows the dependence of ΔT on the leakage resistance $R_L$ for different voltage levels. First, it can be observed that leakage faults increase the oscillation period, which makes them distinguishable from the fault-free case as well as resistive open faults. Second, strong leakage faults below a certain threshold, $R_L \approx 1$ kΩ, inhibit the circuit from oscillating. In other words, the TSV exhibits stuck-at-0 behavior. This threshold depends on the supply voltage: the threshold drops as the supply voltage increases. The third observation is that in the regions slightly above each threshold, ΔT is sensitive to small variation in leakage. This indicates that it is possible to detect leakage of a wide range when testing at different voltage levels. Strong leakage ($R_L$ low) will show up at higher $V_{DD}$. Weak leakage will become detectable at lower $V_{DD}$.

Figure 10:
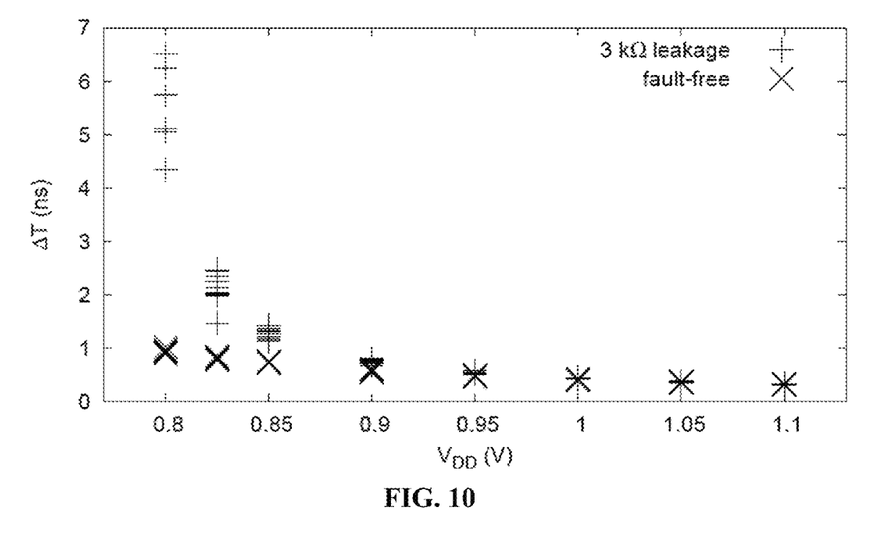
FIG. 10 shows a MC simulation plot for a fault-free TSV and a TSV with a leakage fault of size 3 kΩ, showing ΔT as a function of supply voltage comparing the fault-free case with the case of 3 kΩ leakage fault.

MC simulations verify the robustness of the test method of embodiments of the invention. FIG. 10 shows the results of MC simulations for a 3 kΩ leakage fault and the fault-free case at different voltage levels. As shown in FIG. 10, in the sensitive region right above the threshold (≈0.75 V), the data points for the two cases do not overlap. As $V_{DD}$ is increased, the gap between the two cases becomes smaller such that it becomes more difficult to distinguish between the faulty and fault-free cases.

Accordingly, selection of voltage for detection of a certain leakage fault depends on the size of the leakage fault. For weaker leakage ($R_L$ high), a lower supply voltage is used to detect the leakage.

The simulation results confirm that resistive opens and leakage faults significantly change the oscillation period T and hence it is possible to detect the faults using the methods described herein. Since resistive opens reduce T and leakage faults increase T, these fault types are distinguishable from each other. The results also show that fault detectability can be increased when the TSVs are tested at multiple voltage levels.

Detection Resolution Limitations

Even though the effects of process variations can be reduced by cancelling out the propagation delay of all elements in the oscillation loop except for the segment with the TSV under test, the variations in this segment may limit the detection resolution. In particular, where small deviations exist, it can be difficult to identify whether the deviation in T from that of a fault-free case is caused by a TSV defect or due to variations in the gates or both. Therefore, for each measured T, there is a certain range of faults that correspond to it (aliasing). This range depends on the process parameters and on the circuit layout. A more mature process and a more robust circuit layout reduce aliasing.

Figure 11A:
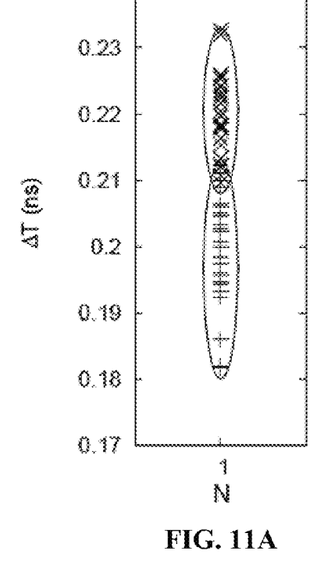
FIGS. 11A-11C show spread overlap for fault-free and faulty (1 kΩ resistive open at x=0.5) cases with increasing N.
Figure 11B:
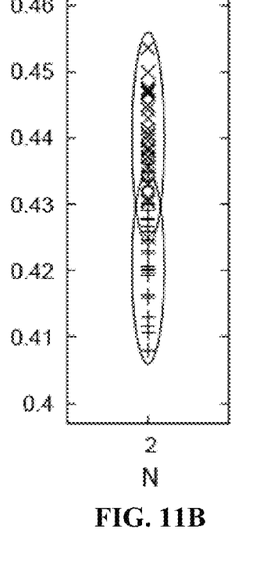
Figure 11C:
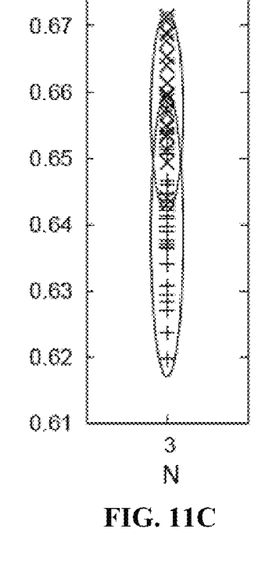

According to embodiments of the invention, simultaneous testing of N TSVs included in one oscillator loop is possible. A number of MC simulations were performed for different values of N. FIGS. 11A-11C show spread overlap for fault-free and faulty (1 kΩ resistive open at x=0.5) cases with increasing N; FIG. 11A shows N=1; FIG. 11B shows N=2; and FIG. 11C shows N=3. In case N=1, the overlap is relatively small, hence the probability for aliasing is also small and the fault is likely to be detected. As N increases, the overlapping areas grow such that the faulty and the fault-free cases may have additional difficulty in being distinguished due to the current configuration not cancelling the effect of process variation for the N segments under test. Therefore, there is a trade-off between the number of TSVs tested in parallel and detection resolution.

Another mechanism limiting detection resolution is measurement inaccuracy of binary counters and LFSRs. A reference clock may be used to generate "reset" and "stop" signals for the counter such that the time interval t between them is known. The clock input of the counter is driven by the oscillator output signal, the period of which is measured for the TSV test. After "reset", the counter starts counting and stops after "stop". Subsequently, the counter is reconfigured into a shift register and the counter state (signature) c is shifted out to the test equipment for post-processing. The oscillation period is then calculated as $$T^* = \frac{t}{c}.$$

Figure 12:
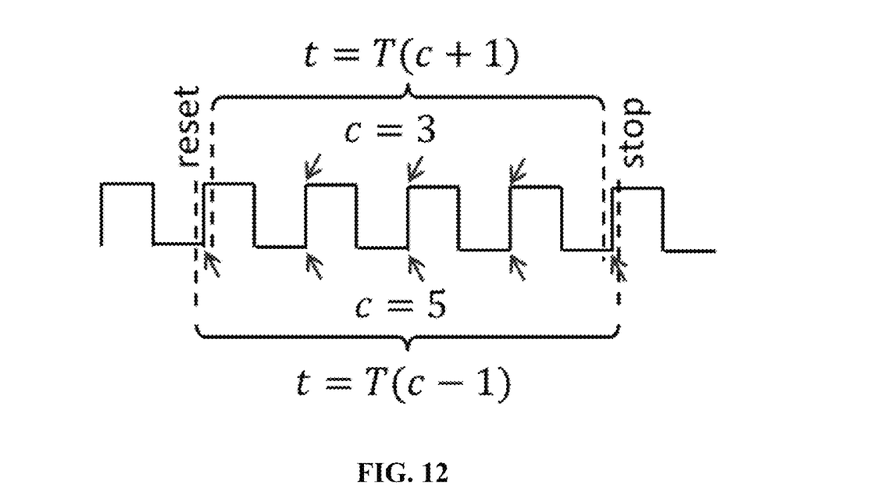
FIG. 12 illustrates "reset" and "stop" positions on an output voltage signal waveform.

This value may differ from the actual oscillation period T due to the digital nature of the counter as a measurement circuit. FIG. 12 shows two extreme cases of "reset" and "stop" times with respect to the waveform of the oscillating signal $V_{out}$.

In one case, the counter is reset shortly after a rising edge of $V_{out}$ and stopped shortly before a rising edge, such that the counter "misses" an entire cycle. In the opposite extreme case, the counter is reset shortly before a rising edge of $V_{out}$ and stopped shortly after a rising edge. As a result, the counter will count one extra cycle. Therefore, upper and lower bounds exist for the counter state based on t and T:

$$\frac{t}{T} - 1 \le c \le \frac{t}{T} + 1$$

In the first extreme case, the calculated period T* will be larger than the actual one:

$$T^* = \frac{t}{c} = \frac{t}{\frac{t}{T} - 1} = T\left(\frac{t}{t-T}\right) > T$$

The absolute error $E_+$ can be calculated for this case by subtracting T from this result:

$$E_+ = T^* - T = \frac{T^2}{t - T}$$

Similarly, the other case will result in a T* smaller than T with the error $$E_- = T - T^* = \frac{T^2}{t + T}.$$

Since t>>T for precise measurements, both errors can be approximated as $$E = \frac{T^2}{t}.$$

This implies that the measurement result obtained with a binary counter will be no worse than T±E.

As an example, consider a ring oscillator configuration with T=5 ns (200 MHz). For a maximum error E=0.005 ns, a time interval t≥$5^2$/0.005 ns=5 µs is used. The counter state after 5 µs will be 1000, which means that at least a 10-bit binary counter is used with the maximum error of 0.005 ns.

DfT Area Cost

The standard cell area overhead of the DfT design described herein is relatively small. Per TSV, two multiplexers are included to select between functional and test signals and to be able to include (exclude) any TSV into (from) the oscillator loop. The inverter in each ring oscillator is shared among N TSVs. In the experiments, multiplexers from the Nangate 45 nm library were used with the standard cell area 3.75 µm² and inverters with the standard area 1.41 µm². If the functional design incorporates 1000 TSVs and N=5, the total standard cell area of the oscillators is 2×3.75×1000+1.41×1000/5=7782 µm²<0.01 mm², which is less than 0.04% of a 25 mm² large die and hence is negligible.

The circuitry for test control and measurement of the oscillation period can be implemented using standard digital cells. This DfT hardware can be shared among multiple TSV groups such that the total amount of pre-bond TSV test logic becomes negligible compared to the area of the entire die.

As illustrated by the examples and described herein, a method for pre-bond TSV test is possible using ring oscillators. The method using ring oscillators is shown to detect leakage and resistive-open faults early during manufacturing testing, thereby increasing the product yield.

Electromigration and TSV stress cause resistive open and leakage defects to become aggravated over time. According to certain embodiments, a high degree of resolution (e.g., leakage resistance detectable up to 1-5 kΩ, 0.2-1 mA leakage current at 1 V supply voltage) is possible, enabling the identification of weak faults that might become critical during "aging" of the product. Even though some of these faults and defects become more easily detectable in the field, by using embodiments of the invention, it is possible to target resistive opens and leakage early during manufacturing testing, improving the product yield, reducing long-life failures, and decreasing the need for field testing.

Advantageously, the methods described herein are non-invasive: no TSV probing is required, which avoids the increased cost for the probe equipment and the possible damage to the TSV caused by TSV probing. Since standard cells can be used for the DfT structures, no custom circuit layout is required.

Different levels of supply voltage can be exploited to increase resolution (and provide a high degree of resolution). The results show that the test for resistive open defects is more robust at higher voltage levels. Leakage faults, in contrast, show better sensitivity at lower voltages. Accordingly, various embodiments provide adjustable supply voltage levels in order to maximize sensitivity for each type of defect. In one embodiment two voltage levels are used during testing: one voltage level for testing resistive open defects and another voltage level for testing leakage.

For each voltage level, there is a certain range of the leakage that can easily be detected. By using multiple voltage levels, weak leakage faults that are hard to detect at the nominal voltage can be detected. Monte Carlo simulations show that the methods described herein are effective in the presence of process variations.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

We claim:

1. A method of pre-bond testing through-silicon vias (TSVs), the method comprising:
generating a reference value from known fault-free TSVs by connecting at least one reference TSV as a reference load in a reference ring oscillator and measuring a reference oscillation period for the at least one reference TSV;
performing a parametric test of TSVs using a ring oscillator in which each TSV is configured at one end for connection as a load in the ring oscillator, wherein performing the parametric test of the TSVs comprises connecting at least one of the TSVs as the load in the ring oscillator and measuring an oscillation period while the at least one of the TSVs is connected as the load;
detecting defects in the TSVs based on deviations in the oscillation period compared to the reference value from the known fault-free TSVs; and
performing the parametric test of TSVs a first time using a first supply voltage and a second time using a second supply voltage level different than the first supply voltage level, wherein a higher of the two supply voltage levels is applied to detect a resistive open fault defect and a lower of the two supply voltage levels is applied to detect a leakage fault defect.

2. The method of claim 1, wherein detecting the defects in the TSVs comprises:
determining an existence of a resistive-open fault in response to determining that the deviations in the oscillation period compared to the reference value indicate a reduced oscillation period for the oscillation period.

3. The method of claim 1, wherein detecting the defects in the TSVs comprises:
determining an existence of a leakage fault in response to determining that the deviations in the oscillation period compared to the reference value indicate an increased oscillation period for the oscillation period.

4. The method of claim 1, wherein generating the reference value from the known fault-free TSVs further comprises averaging a plurality of measured reference oscillation periods.

5. The method of claim 1, wherein the known fault-free TSVs are from a different chip as that having the TSVs undergoing the parametric test, the reference ring oscillator being a ring oscillator from the different chip.

6. A method of pre-bond testing through-silicon vias (TSVs), the method comprising:
connecting at least one TSV of a plurality of TSVs to a ring oscillator, wherein each TSV of the plurality of TSVs is configured at one end for connection as a load in the ring oscillator;
applying a first supply voltage level to power a design for test (DfT) circuitry connecting the at least one TSV to the ring oscillator;
performing a first parametric test of the at least one TSV using the ring oscillator and measuring a first oscillation period of the ring oscillator while applying the first supply voltage level;
detecting a presence of defects in the at least one TSV based on deviations in the first oscillation period compared to a first reference value;
applying a second supply voltage level different than the first supply voltage level to power the DfT circuitry;
performing a second parametric test of the at least one TSV using the ring oscillator and measuring a second oscillation period of the ring oscillator while applying the second supply voltage level; and
detecting the presence of defects in the at least one TSV based on the deviations in the second oscillation period compared to a second reference value.

7. The method of claim 6, wherein a higher of the two supply voltage levels is applied to detect a resistive open fault and a lower of the two supply voltage levels is applied to detect a leakage fault,
wherein detecting the presence of defects in the at least one TSV while applying the lower of the two supply voltage levels comprises determining an existence of the resistive-open fault in response to determining that the deviations indicate a reduced oscillation period for the oscillation period; and
wherein detecting the presence of defects in the at least one TSV while applying the higher of the two supply voltage levels comprises determining an existence of the leakage fault in response to determining that the deviations indicate an increased oscillation period.

8. A method of pre-bond testing through-silicon vias (TSVs), the method comprising:
generating a reference value from known fault-free TSVs by connecting at least one reference TSV as a reference load in a reference ring oscillator; measuring a first reference oscillation period for the reference ring oscillator while the at least one reference TSV is connected as the reference load; measuring a second reference oscillation period of the reference ring oscillator while all the reference TSVs are bypassed; and calculating a reference difference between the first reference oscillation period and the second reference oscillation period;
performing a parametric test of TSVs using a ring oscillator in which each TSV is configured at one end for connection as a load in the ring oscillator, wherein performing the parametric test of the TSVs comprises connecting at least one of the TSVs as the load in the ring oscillator; measuring a first oscillation period of the ring oscillator while the at least one of the TSVs is connected as the load; measuring a second oscillation period of the ring oscillator while all the TSVs are bypassed; and calculating an oscillation period difference between the first oscillation period and the second oscillation period, wherein the reference difference provides the reference value; and
detecting defects in the TSVs based on deviations in the oscillation period difference compared to the reference value from the known fault-free TSVs.

9. The method of claim 8, comprising performing the parametric test of TSVs a first time using a first supply voltage level and a second time using a second supply voltage level different than the first supply voltage level, wherein a higher of the two supply voltage levels is applied to detect a resistive open fault defect and a lower of the two supply voltage levels is applied to detect a leakage fault defect.

* * * * *